United States Patent [19]

Suhr et al.

[11] Patent Number: 4,990,363
[45] Date of Patent: Feb. 5, 1991

[54] METHOD OF PRODUCING VERY ADHESIVE METALLIC STRUCTURES ON FLUORINE POLYMERS AND THERMOPLASTIC SYNTHETIC MATERIALS

[75] Inventors: Harald Suhr, Tübingen; Christa Haag, Ofterdingen, both of Fed. Rep. of Germany

[73] Assignee: Schering Aktiengesellschaft, Berlin and Bergkamen, Fed. Rep. of Germany

[21] Appl. No.: 289,368

[22] Filed: Dec. 22, 1988

[30] Foreign Application Priority Data

Dec. 22, 1987 [DE] Fed. Rep. of Germany ....... 3744062

[51] Int. Cl.$^5$ .............................................. B05D 3/06
[52] U.S. Cl. ...................................... 427/40; 427/39; 427/98; 427/443.1
[58] Field of Search .................... 427/39, 40, 98, 443.1

[56] References Cited

U.S. PATENT DOCUMENTS

| 4,582,564 | 4/1986 | Shanefield et al. | 427/40 |
| 4,717,587 | 1/1988 | Suhr et al. | 427/40 |
| 4,731,539 | 3/1988 | Xu | 204/192.31 |
| 4,803,094 | 2/1989 | Myers | 427/124 |

Primary Examiner—Stanley Silverman
Attorney, Agent, or Firm—Michael J. Striker

[57] ABSTRACT

A method of producing metallic structures on non-conductors includes the steps of metallizing the nonconductors by decomposing of metallo-organic compounds in a glow discharge with formation of a metallic film, and utilization as the non-conductors synthetic plastic materials from fluorine polymers or thermoplastic synthetic plastic materials.

13 Claims, 4 Drawing Sheets

METHOD OF PRODUCING VERY ADHESIVE METALLIC STRUCTURES ON FLUORINE POLYMERS AND THERMOPLASTIC SYNTHETIC MATERIALS

BACKGROUND OF THE INVENTION

The present invention relates to a method of producing metallic structures on non-conductors by decomposing of metallo-organic compounds in a glow discharge with formation of a metallic film.

The production of metallic films on synthetic plastic materials is performed in a conventional manner normally in a wet chemical process. More particularly, the parts to be metallized are immersed in a special row of cleaning, etching, conditioning, activating and metallizing baths which are special for a substrate. The outer surfaces after the cleaning and conditioning are first seeded with prescious metal-containing solutions, and then metallized on the activated surfaces in accordance with a conventional process.

The treatment baths are as a rule aqueous solutions which however partially contain organic solvents. The disadvantage of this approach is partially high toxicity with considerable volatility of the utilized compounds, which requires respective safety precautions. In the case of polytetrafluorethylene because of the high hydrophoby of the material, only a purely organic formulation on the basis of sodium-carbanion complexes as etching solution is known, which insures a sufficient adhesion of the finally applied metal film. For the reason of the toxicity of the pretreatment chemistry and safety reasons polytetrafluorethylene as a substrate in the electronic industry cannot be used, despite the fact that with respect to its electrical and chemical characteristics it exceeds the majority of other materials. The discharge of the toxic treatment baths is also problematic.

A further essential disadvantage of the wet chemical process is that the relatively complicated treatment sequences are provided before the metallization for reaching the desired adhesion value. In each case the parameters of the process, such as for example temperature and treatment time must be maintained within narrow limits and therefore, in this condition a considerable process control is required. The danger of contamination of the treatment baths by the process-conditional fluctuations is high and can lead to substantial quality fluctuations. The aggressiveness of the treatment solutions in these conditions acts to reduce the quality of covering varnish or foil.

Another coating process includes a thermal dosing of volatile metal compounds. This process requires very high substrate temperatures (approximately 200° C., and in practice between 300° and 1,000° C.). In the case of the above mentioned materials it can not be used or can be used with danger of damages to the material.

SUMMARY OF THE INVENTION

Accordingly, it is an object of the present invention to provide very adhesive metallic structures on fluorine polymers or thermoplastic synthetic materials. The thus produced semi-products are used for example in the electronic industry, particularly for producing of printed circuits, hybrid circuits, chip carriers of three-dimensional shaped bodies with conductor path structures or completely surface metallized three-dimensional shaped bodies to be used for screening of electromagnetic fields. The above mentioned materials, such as for example polytetrafluorethylene, polyamide, polyetherimide and -sulfon, polyparaphenylen sulfide, polyester or paracrystalline polymers differ from conventional polymers, such as for example epoxy resin used in the printed circuit technique, by significantly better electrical, mechanical and chemical properties, and in the case of the thermoplastic materials have an additional advantage that they can be produced by the technique of injection casting in relatively simple manner in any three-dimensional shape.

In keeping with these objects and with others which will become apparent hereinafter, one feature of the present invention resides, briefly stated, in a method of producing metallic structures on non-conductors by decomposing of metallo-organic compounds in a glow discharge with formation of metallic film, wherein as non-conductors synthetic materials from the group of fluorine polymers or the thermoplastic synthetic materials are utilized.

The novel features which are considered as characteristic for the invention are set forth in particular in the appended claims. The invention itself, however, both as to its construction and its method of operation, together with additional objects and advantages thereof, will be best understood from the following description of specific embodiments.

DESCRIPTION OF THE PREFERRED EMBODIMENTS

Figure 1:
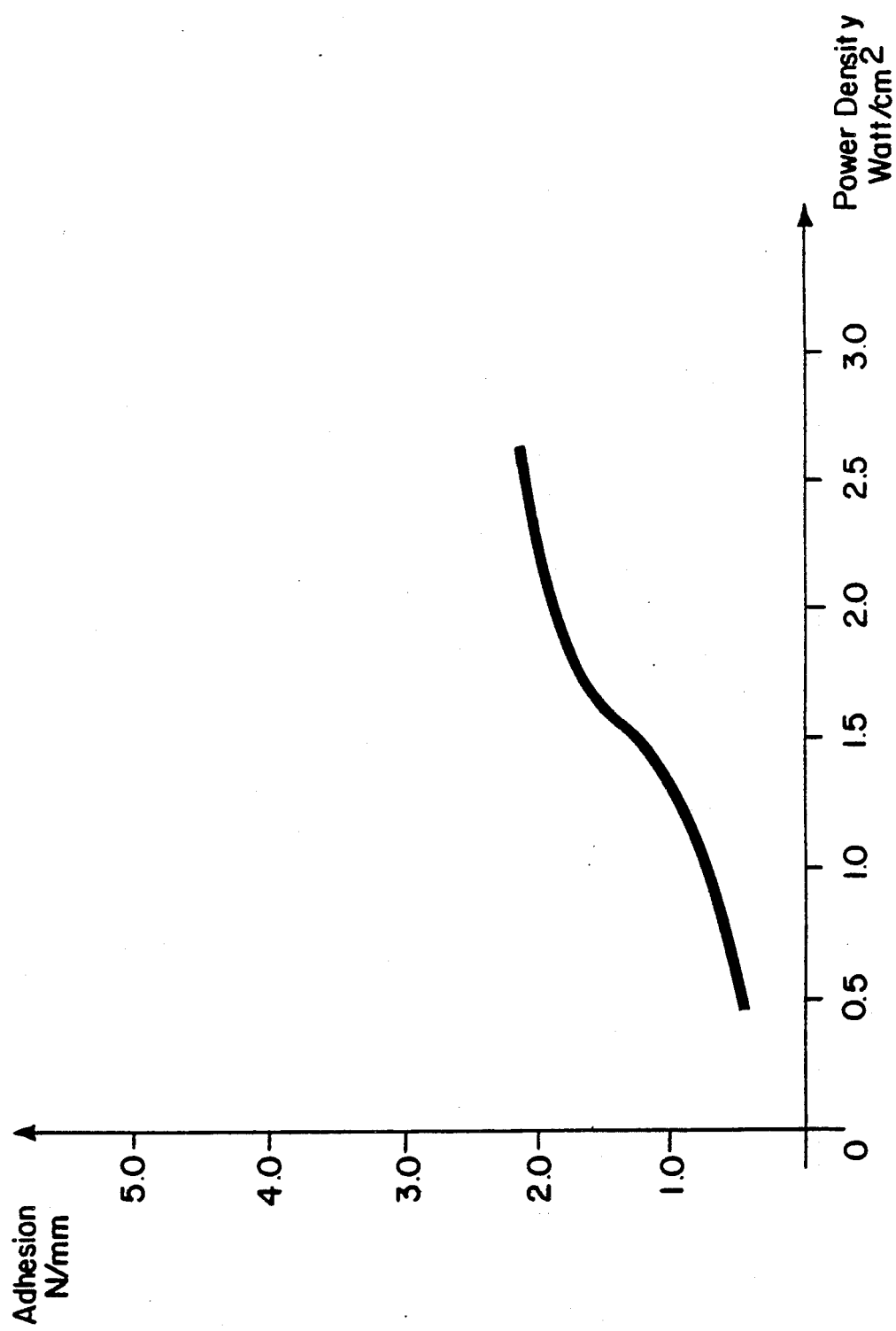

In accordance with the present invention, the production of metallic structures on non-conductors by decomposing of metallo-organic compounds in a glow discharge with formation of a metallic film, is performed so that as non-conductors, synthetic materials from the group of fluorine polymers or thermoplastic synthetic materials are used.

The inventive process overcomes the disadvantage of the known processes or at least reduces the same in that the wet chemical working cycle up to the first metallization, and in special embodiments of the present invention the whole above-mentioned wet chemical working cycle including the first metallization, is avoided. In accordance with the present invention this is achieved in that the metallization of the above-mentioned materials by decomposing of metallo-organic compounds is performed in a plasma. Depending on the treatment type, layers of several hundred to 2,000 Å are produced, and subsequently without further treatment can be reinforced in a chemical copper or nickel hath in a galvanic bath (preferably copper bath) until they reach the desired layer thickness.

In the cases of thicker cohesive metal layers, it is advantageous in accordance with the present invention to directly add a galvanic metallization.

The production of metallic structures can be performed in accordance with one of the known processes, such as for example, additive, semi-additive, subtractive technique. The surface of the substrate during the plasma metallization is covered by a mask, so that those locations are released which must carry the metallic structures. In accordance with other embodiments the structurizing for example with the aid of screen printing varnishes, photo varnishes or photoresist layers are used.

It is to be understood that a structurizing in accordance with semi-additive or subtractive technique can be performed also during the eventually carried out wet chemical metallization process by the utilization of known processes.

The metallization in accordance with the inventive process is performed by decomposing of metallo-organic compounds, for example elements of 1 and 8 subgroups in glow discharge plasma. However, other metallo-organic compounds of transition metal or main group metals can be used, such as for example zinc compounds.

Such metallo-organic compounds are utilized which can be converted into the gas phase non-decomposed, eventually under heat. The example of such compounds is $\pi$-allyl-$\pi$-cyclopentadienyl-palladium, dimethyl-$\pi$-cyclopentadienylplatinum, dimethyl-gold-acetylacetonate and copper-hexafluoracetylacetonate.

For the inventive process especially advantageous are combination of several metals of which some have an especially high adhesion to substrate and others are used for subsequent metal layer. Such utilization is described in the examples.

The plasma metallization is advantageous in accordance with the technique of known sputtering process which can insure metallization of complicated shaped parts. It is possible to achieve a metallization in gaps, holes (for example openings in electrical printed circuits) or in immediate regions of undercuts.

The metallization is performed in normal plasma reactors which are known mainly as tubular or tunnel reactors or parallel plate reactors and reactors for corona discharge. For the production of metallic films and structures, the plasma can be produced both with direct current and with alternating current or with high frequency (including microwaves), generally in kHz- or MHz-region. The pressure in the plasma chamber amounts to 0.1-2.0 hPa. As substrates can be used the above mentioned fluorine polymers, such as for example polytetrafluorethylene, and thermoplastic synthetic materials, such as for example polyamide, polyetherimide, and sulfone, polyparaphenylsulfide, polyester and paracrystalline polymers in different embodiments: as test materials or foils with or without fillers, one layer or multi-layer.

The metallo-organic compounds which are used in the inventive process for metallization are supplied to the plasma reactor in a gaseous form, for example by sublimation or evaporation. They can be used alone, however, they are diluted with carrier gases for obtaining uniform pore-free layers. Inert gases can be used as carrier gases, such as for example argon and helium or reducing gases such as hydrogen. Also mixtures of the gases can be used. The supply of the organo-metal compounds is performed after producing the vacuum outside of the glow discharge zone in the stream of the carrier gas so that in the reaction region proper a uniform gas mixture is provided. The supply container for the metal compounds is advantageously provided with an arrangement for heating, for supplying hardly sublimable metal compounds in a sufficient quantity into the gas stream.

An especial embodiment of the present invention is that prior to the metallizing process in the plasma discharge, a plasma etching process is performed for cleaning the substrate surface and for making it susceptible to the receipt of the metal layer. The embodiment of the reactor and the process conditions do not differ in principle from the plasma metallization process. It is to be understood however that during the plasma etching process no metallo-organic compounds are utilized. Advantageously a reactive gas is added to the inert carrier gas, such as for example oxygen or tetrafluormethane oxygen. The film obtained during the metallized can be reinforced in the glow discharge zone in a bath for a chemically reducing metal coating.

In accordance with an alternative process variant, the etching process and the metallization in plasma are performed in one working step. For example, the etching gas is supplied directly after the etching process through the container which contains the metallo-organic compound, so that the metallo-organic compound is brought into the reaction zone and the metal deposition is performed. An example of this utilization is described.

The following examples serve for illustration of the present invention.

EXAMPLE 1

Deposition of Copper on Polyetherimide

Reactor type: Parallel plate reactor
Frequency: 13.56 MHz
Substrate: Polyetherimide plates, non-filled (ULTEM ® of the company General Electric Plastics)
Substrate temperature: 293 K 1. Pretreatment Etching gas: $O_2$/Ar-mixture 1:1
Pressure in Reactor: 8 Pa
Action time: 30 minutes 2. Metallization Metallo-organic compound: Copperhexafluoracetylacetonate
Temperature of the reservoir of the metallo-organic compound: 338 K
Carrier gas: hydrogen
Pressure in the reactor: 25 Pa
Action time: 10 minutes A polyethyerimide plate (70×40×4 mm) is provided with a mask of stainless steel, so that the region on the plate remains which must carry the printed circuit structures. Subsequently the plate is placed on a lower larger plate of the reactor, the reaction chamber is evacuated and the plasma is ignited. After a treatment of $O_2$-Ar-stream the metallization in accordance with the above presented conditions is performed. A copper film of approximately 100 Å thickness is produced.

The metallized probe is taken from the reactor, the mask is removed, and the copper structure which corresponds to the shape of the mask on the plate is reinforced with a chemically reducing copper bath.

The same tests are performed with polyparaphenylsulfide (for example RYTON R4® of the company DuPont) or the paracrystalline synthetic plastic material VECTRA ® (company Celanese). In this case the following changed pretreatment and metallizing parameters are selected:

EXAMPLE 2

A Teflon substrate is directly subjected to plasma metallization without pretreatment. The conditions are as follows:

Metallo-organic compound: $\pi$-Allyl-$\pi$-cyclopentadienylpalladium
Carrier gas: aron, 100 sccm standard $cm^3$
Pressure in the reactor: 9 Pa
Current density: 0.44 Watt/$cm^2$ Exposition time: 5 minutes After the plasma metallization a currentless and galvanic metallization is performed for obtaining the adhesive strength. It amounts only to 0.3-0.4 N/mm.

A palladium film with a thickness of 100 Å is obtained. The metallized substrate is subsequently copper plated without further pretreatment in a currentless copper bath, so as to obtain a dense and gap-free metal layer. For determination of the adhesion it is reinforced with a galvanic copper electrolyte of approximately 30 m. After a tempering at 50°-70° C. the adhesive strength of 2-3 N/mm is obtained. The copper foil removed during a peeling test has on the rear side adhering substrate material since the breakage is performed inside the connection system Teflon-glass fiber fabric.

EXAMPLE 3

Deposition of Gold on Polytetrafluorethylene

Reactor type: Parallel plate reactor
Frequency: 13.56 MHz
Substrate: Polytetrafluorethylene foil with thickness of 0.5 mm
Substrate temperature: 293K 1. Pretreatment Etching gas: Tetrafluormethane/oxygen mixture = 1/3.5
Pressure in the reactor: 8 Pa
Action time: 30 minutes 2. Metallization Metallo-organic compound: dimethyl-gold-acetonyl-acetate
Temperature of the reservoir of the metallo-organic compound: Gold: 313 K
Carrier gas: Argon
Pressure in the reactor: 10 Pa
Action time: 10 minutes The polytetrafluorethylene foils as described in the Example 1 are provided with a metal mask. In the first case, the foils are metallized under the above described conditions without pretreatment. The probes are reinforced in a chemical reducing copper bath to approximately 4 μm and subsequently reinforced over the galvanic edge in a galvanic copper bath to approximately 20 μm to provide cohesive metal structures.

After a tempering of the probe for 25 hours at 50° C. the peeling test showed an adhesion of approximately 0.5 N/mm.

If prior to the metallization a pretreatment in plasma under the above mentioned conditions is performed, then after the tempering the adhesion value is approximately 3-3.5 N/mm.

EXAMPLE 4

The Teflon substrate is pretreated with different current densities of the plasma. Test parameters of the plasma treatment and metallization, currentless and galvanic copper plating are similar to those in the Example 3. The measured adhesive strength is presented in FIG. 1.

EXAMPLE 5

Figure 2:
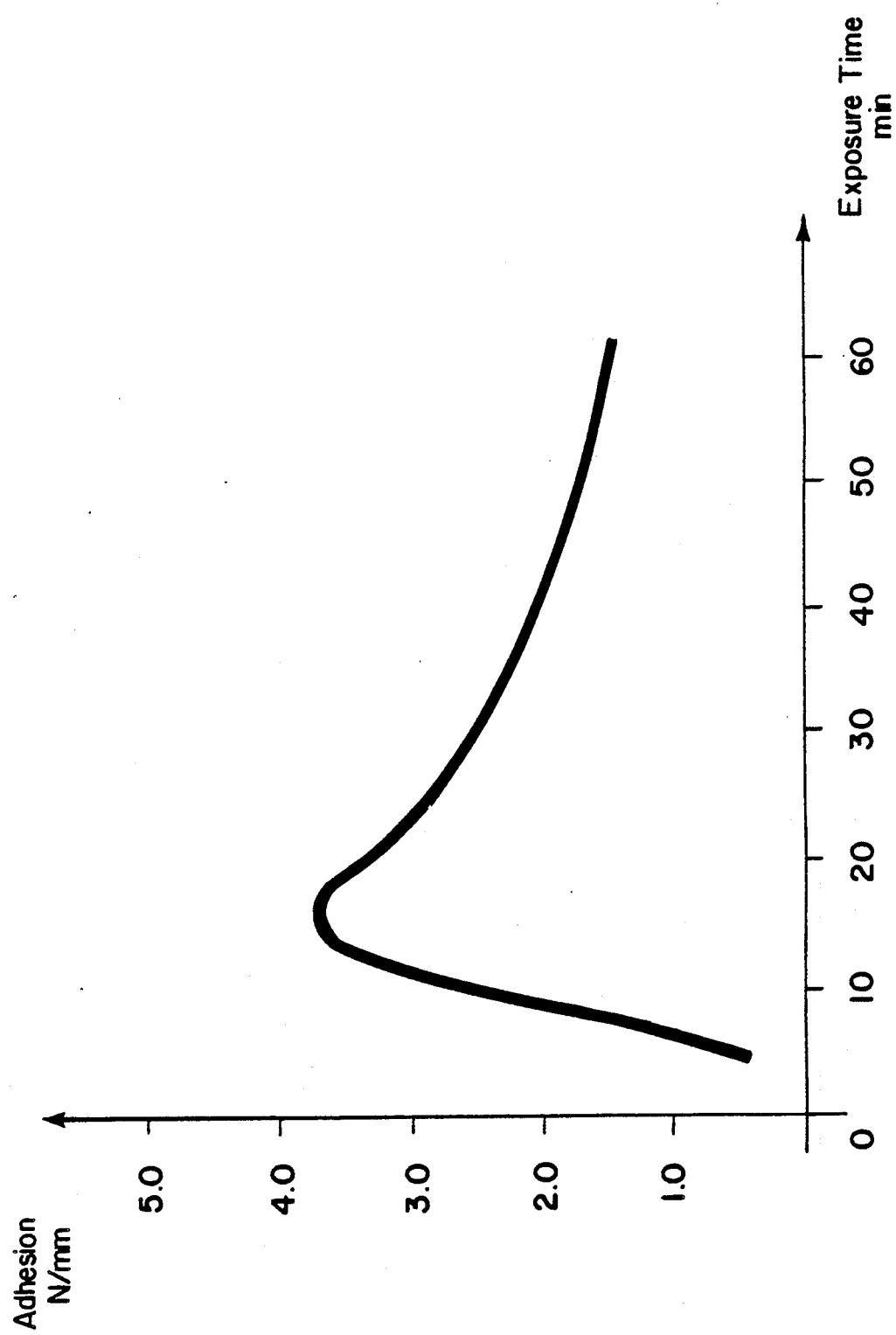

This example corresponds to the Example 3, however there are variations in the duration of the plasma treatment. The results are shown in FIG. 2.

EXAMPLE 6

Figure 3:
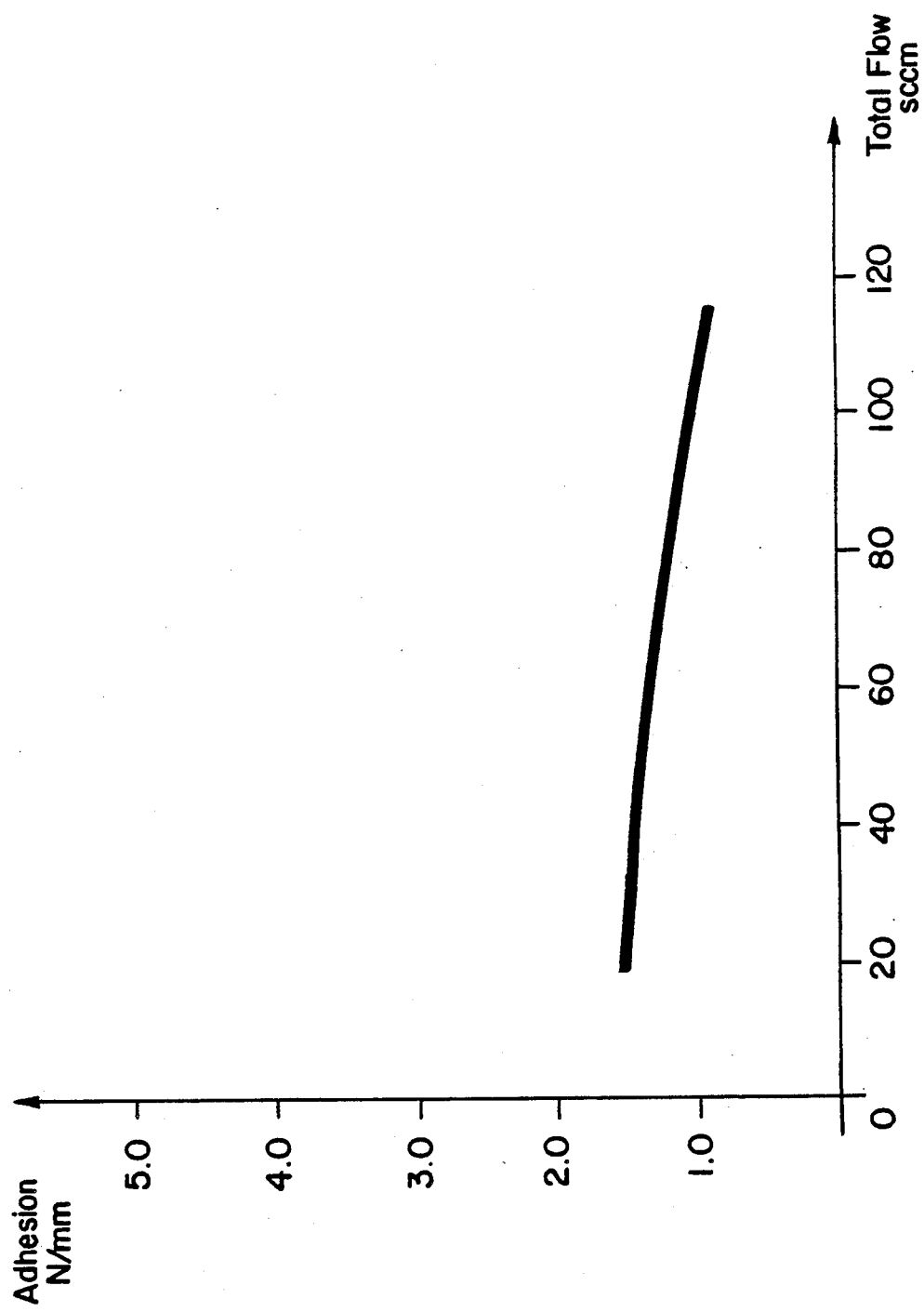

This example corresponds to Example 3, however, there are variations in the throughflow rate of $CF_4/O_2$-gas mixture during the plasma treatment (7/4V/V). There results are presented in FIG. 3.

EXAMPLE 7

This example corresponds to the Example 3 with variation in the throughflow rate of the argon during the metallization. No dependency has been found. The adhesive strength lies between 1.1 and 1.7 N/mm.

EXAMPLE 8

Figure 4:
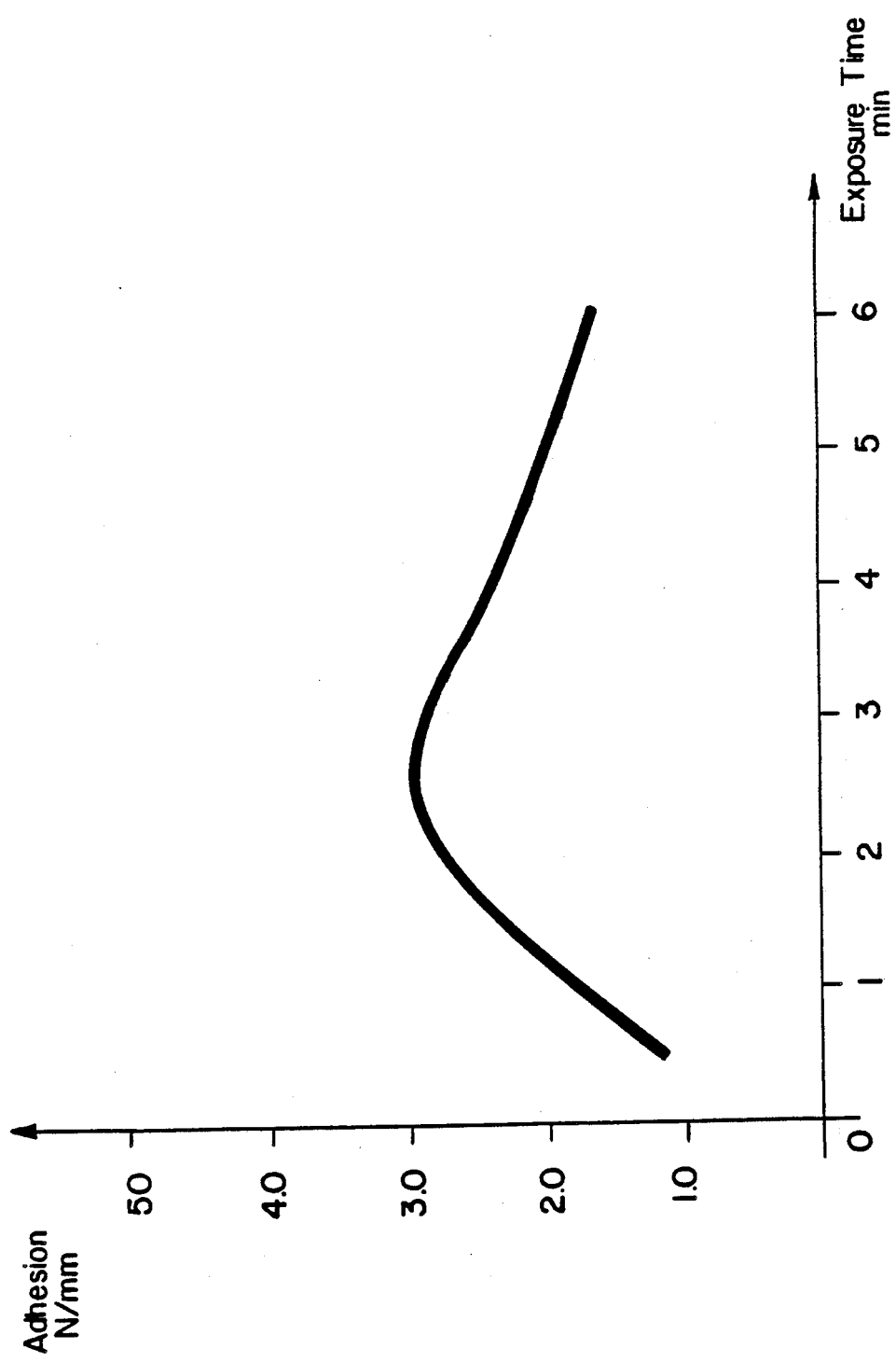

This example corresponds to the Example 3, with variations in the exposition time during the metallization. The results are shown in FIG. 4. It can be seen that a short metallization (seeding) time for achieving maximum adhesion is advantageous. With the extension of the exposition time, the adhesive strength of the metal coating is reduced.

EXAMPLE 9

The adhesive strength of copper films on Teflon/glass fiber substrates which are pretreated in plasma and seeded with different metals is measured. The experimental conditions were as follows:
Pretreatment: 1.32 Watt/cm² 10 minutes exposure time
Metallizing: 100 sccm Argon 0.44 Watt/cm² 5 minutes exposure time
The results are presented in Table 1.

TABLE 1

| Metal Compound | Adhesive Strength/Nmm$^{-1}$ |
|---|---|
| Gas composition: | |
| 20 sccm $O_2$, 35 sccm $CF_4$: | |
| π-allyl-π-cyclopentadienyl-palladium | 3.0-5.0 |
| Dimethyl-gold-acetonyl-acetate | 2.5-3.5 |
| Gas composition: 35 sccm $O_2$, 35 sccm Ar: | |
| π-allyl-π-cyclopentadienyl-palladium (A) | 1.5-2.0 |
| π-allyl-π-cyclopentadienyl-platinum (B) | approx. 1.5 |
| Dimethyl-Gold-acetonylacetate | approx. 1.5 |
| Copperhexafluoroacetonylacetate (carrier gas 300 sccm $H_2$) | approx. 2.5 |
| Mixture of A and B | 3.0-3.5 |

EXAMPLE 10

In conditions corresponding to the conditions of the Example 9 (with palladium-metallization), composition of the pretreatment gas mixture is varied. The total throughflow rate of the gas mixture is adjusted to 70 sccm constant. The results are presented in Table 2.

TABLE 2

| Gas Composition | Adhesive Strength/Nmm$^{-1}$ | Relative Etching Rate for Plasma Pretreatment (Reference 100% $CF_4$ = approx. 100%) |
|---|---|---|
| 50% $O_2$ 50% Ar | 2.0-3.75 | — |
| 50% $O_2$, 22% Ar 28% $CF_4$ | 1.5-2.5 | — |
| 50% $O_2$, 50% $CF_4$ | approx. 1.0 | 100 |
| 28% $O_2$, 72% $CF_4$ | 3.0-5.0 | 95 |
| 72% $O_2$, 28% $CF_4$ | 1.9-3.0 | 104 |
| 100% $CF_4$ | 1.0-1.5 | 100 |

EXAMPLES 11-16

The metallization tests are performed on different synthetic plastic materials. The reaction conditions are as in the Example 3. The tests results are presented in Table 3. In each case after the peeling tests synthetic plastic residuals are found on the rear side of the removed copper strip.

TABLE 3

| Synthetic Plastic Material | Adhesive Strength/Nmm$^{-1}$ |
| --- | --- |
| 1. Acrylnitrile-butadiene-styrol-copolymer | 0.8–1.1 |
| 2. Acrylnitrile-butadiene-styrol-copolymer | 1.5–1.6 |
| 3. Polycarbonate-polyester-copolymer | 1.1–1.3 |
| 4. Polyphenylenoxide | 1.0–1.2 |
| 5. Polyamide | approx. 2.0 |
| 6. Polyamide | 1.1–1.3 |

EXAMPLE 17

A Teflon/glass fiber reinforced substrate is pretreated in plasma as in the Example 3 and metallized. Subsequently, it is metallized directly for 1.5 hour long in a conventional currentless nickel bath. A nickel layer of approximately 30 μm thickness is obtained. The measured adhesive strength amounts as during a currentless and galvanic copper plating to 2–3 N/mm.

EXAMPLE 18

A drilled Teflon/glass fiber substrate with 1.3 mm openings is treated in plasma and metallized with test conditions as in the Example 3. Subsequently a currentless copper plating is performed. The obtained copper layer thickness amounts to 0.2–0.3 μm. For testing the metal coating on the bore hole wall the bore hole is cut along and illuminated from the rear side by the substrate material through with a powerful air source in a so-called through light test. Under the microscope no bright points are determined which identifies faulty metal coating on the bore hole inner side.

EXAMPLE 19

A Teflon substrate is pretreated over its whole surface in plasma in a process corresponding to Example 3, metallized and subsequently copper plated in a wet chemical step. The Teflon plate metallized from all sides is treated with a thermal shock in a solder bath (10 s immersed at 288° C.). It forms no bubbles in the copper layer. The adhesive strength of the metal coating is not affected by thermal treatment.

EXAMPLE 20

A Teflon/glass fiber substrate is pretreated in plasma and metallized in the following way:

After reaching the vacuum it is pretreated in a known manner with a CF$_4$/O$_2$ gas mixture (7/4 V/V). After 10 minutes the gas mixture supplied through the container which contains the metallo-organic compound (for example π-allyl-π-cyclopentadienyl-palladium) and thereby additionally the metal compounds is brought in the plasma chamber. Thus, the metal deposition is set into operation. After 5 minutes of exposure time the metal deposition is interrupted. The tests are copper plated as in the Example 3. After the currentless copper plating a dense metal layer is produced. The technical properties of the substrate metallized with approximately 30 μm, such as adhesive strength, solder resistance, correspond to systems described in the preceding examples.

It will be understood that each of the elements described above, or two or more together, may also find a useful application in other types of methods differing from the types described above.

While the invention has been illustrated and described as embodied in a method of producing metallic structures on non-conductors, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A method of producing metallic structures on non-conductors selected from the group consisting of fluorine polymers and thermoplastic synthetic plastic materials, comprising the steps of subjecting a surface of a nonconductor to be metallized to an etching and cleaning process in a glow discharge zone by supplying an etching gas into said glow discharge zone to the surface of the non-conductor; and thereafter metallizing the non-conductor by decomposing of a metallo-organic compound in the same glow discharge zone with formation of a metallic film.

2. A method as defined in claim 1, wherein said metallizing includes supplying the same etching gas after the etching and cleaning process through a container with the metallo-organic compound, so that the metallo-organic compound is brought into the glow discharge zone and the metal deposition is performed.

3. A method of producing metallic structures on non-conductors selected from the group consisting of fluorine polymers and thermoplastic synthetic plastic materials, comprising the steps of subjecting a surface of a non-conductor to be metallized to an etching and cleaning process in a glow discharge by supplying an etching gas to said glow discharge; metallizing the non-conductor by decomposing of metallo-organic compounds in the same glow discharge zone with formation of a metallic film; and reinforcing a film obtained during the metallization by an additional metal coating in the same glow discharge zone.

4. A method as defined in claim 1; and further comprising reinforcing a film obtained during the metallizing in the same glow discharge zone in a bath for a chemically reducing metal coating.

5. A method as defined in claim 3, wherein said reinforcing includes reinforcing in a chemically reducing copper bath.

6. A method as defined in claim 3, wherein said reinforcing includes reinforcing in a chemically reducing nickel bath.

7. A method as defined in claim 3, wherein said metallizing includes providing structures by applying masks on the non-conductors.

8. A method as defined in claim 3, wherein said metallizing includes producing structures on non-conductors by screen printing.

9. A method as defined in claim 3, wherein said metallizing includes producing structures on non-conductors by photo varnishing.

10. A method as defined in claim 3; and further comprising producing structures on non-conductors after the metallizing by means of a photoresist.

11. A method as defined in claim 2; and further comprising producing structures on non-conductors after the metallizing by means of a photo varnish.

12. A method as defined in claim 2; and further comprising producing structures on non-conductors after the metallizing by means of a screen printing varnish.

13. A method as defined in claim 2; and further comprising using organic copper compounds for depositing of the metal film.

* * * * *